United States Patent
Socher et al.

(10) Patent No.: US 7,489,024 B2
(45) Date of Patent: Feb. 10, 2009

(54) TMOS-INFRARED UNCOOLED SENSOR AND FOCAL PLANE ARRAY

(75) Inventors: Eran Socher, Tel Aviv (IL); Ofir Bochobza-Degani, Ashkelon (IL); Yael Nemirovsky, Haita (IL)

(73) Assignee: Technion Research & Development Foundation Ltd., Haifa (IL)

( * ) Notice: Subject to any disclaimer, the term of this patent is extended or adjusted under 35 U.S.C. 154(b) by 444 days.

(21) Appl. No.: 10/545,892

(22) PCT Filed: Feb. 15, 2004

(86) PCT No.: PCT/IL2004/000142

§ 371 (c)(1),
(2), (4) Date: Jun. 5, 2006

(87) PCT Pub. No.: WO2004/074167

PCT Pub. Date: Sep. 2, 2004

(65) Prior Publication Data

US 2006/0244067 A1    Nov. 2, 2006

(51) Int. Cl.
*H01L 23/495* (2006.01)

(52) U.S. Cl. ............... 257/675; 257/706; 257/E31.122; 438/122

(58) Field of Classification Search ................. 257/675, 257/706, 720, E31.122; 438/122
See application file for complete search history.

(56) References Cited

U.S. PATENT DOCUMENTS 5,578,841 A * 11/1996 Vasquez et al. ............. 257/220

* cited by examiner

*Primary Examiner*—Thao X Le
*Assistant Examiner*—Elias Ullah
(74) *Attorney, Agent, or Firm*—Edward Langer Shibolet & Co.

(57) ABSTRACT

An array of uncooled infrared sensors based on a micromachined temperature sensitive MOS transistor. The sensor array is fabricated using a commercial CMOS process on SOI wafers, followed by backside silicon dry etching for each sensor pixel. Active sensor pixels may include either, an integrator and buffer, or simply the sensing transistor, serving also as the selection device. The transistor bias controls the selected device and the sensitivity of the sensor. PMOS transistors and switched operation are used for noise minimization.

34 Claims, 3 Drawing Sheets

TMOS-INFRARED UNCOOLED SENSOR AND FOCAL PLANE ARRAY

FIELD OF INVENTION

Figure 1:
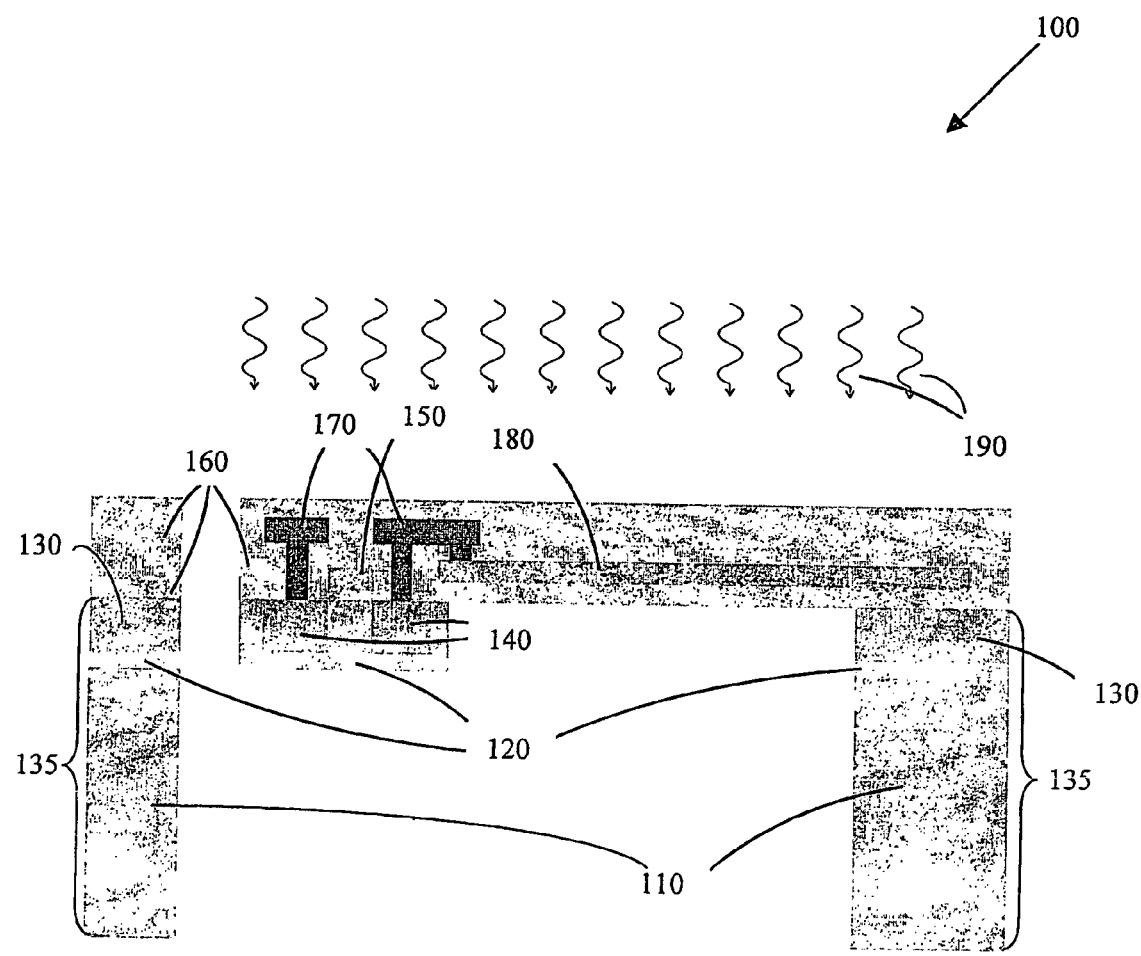

The present invention relates to micromachining and micro-sensor arrays. More particularly, the present invention relates to an array of uncooled infrared transistor-based thermal sensors for use in micromachining and microsensors for Thermally isolated Metal Oxide Semiconductors (TMOS).

BACKGROUND OF THE INVENTION

Thermal sensors are sensors that detect temperature changes at distant targets through the changes in radiation they emit. Since most objects can be treated as physical "black bodies," the amount and the spectrum of radiation they emit strongly depend upon their temperature. The amount of radiation increases with temperature, and the peak wavelength of that emission decreases with temperature, such that objects at room temperature of 300° K. have a peak wavelength at the far infrared range of about 10 μm, while the Sun, with a surface temperature of 6000° K., has a peak wavelength at the visible green (0.5 μm). Therefore, sensors that are sensitive to radiation wavelengths corresponding to significant emission from the target objects can be used to detect changes in their temperature.

Using an array of such sensors, and placing it at the focal plane of an appropriate lens, the arrangement can be used to thermally map a scene, since each pixel in the array responds to a different area in the target. This concept is referred to as focal plane array (FPA), and is widely used in thermal imaging. Since most common objects have temperatures in the neighborhood of 300° K, infrared sensors are usually used for thermal imaging. Common thermal imaging applications include night vision, motion sensing, fire and smoke alarms, thermal mapping and control, and heat seeking applications.

Traditional sensors for the far-end of the infrared range are based on photon counting detectors. These detectors are based on narrow band gap semiconductors that have an energy gap corresponding to the far infrared photon energy. Incident photons are absorbed and their energy is used to generate charge carriers in the detector material. These charge carriers are converted to an electrical signal, such as a voltage or current, using the specific structure of the detector, e.g. a diode.

In order to implement a sensor array for imaging, an array of detectors is fabricated. Since electrical signals have to be read from all the sensor pixels of the array, an electronic readout circuit is used to serially select, amplify and signal process each sensor pixel signal. This circuit includes both analog and digital sub-circuits for operation. In recent years Complementary Metal Oxide Semiconductor (CMOS) technology emerged as the leading technology for digital circuits and as a result it also started to dominate a range of analog and mixed applications. Therefore, it is also found in many applications of thermal imaging. Thus, since the materials used for the readout circuit and the detectors are different, two separate microelectronic chips are fabricated and later flip-chip bonded to one another using conducting bumps that connect each sensor pixel to its dedicated circuit.

Sensors based on photon counting detectors are very sensitive, but suffer from several drawbacks. The major disadvantage is that they require significant cooling for their operation, typically down to cryogenic temperatures of about 77° K. As a result, the package of the sensor has to be evacuated to very a high vacuum, and additional cooling means need to be employed.

These demands, of course, increase the cost of the system, and its size and complexity. The use of exotic semiconductors for the detectors themselves, and the need to use two chips; and bonding them together, also increases the cost and complexity of the product, and reduces the yield and reliability of the system.

The alternative to using photon-counting detectors is to use indirect thermal sensors. Instead of directly converting each photon into an electrical signal, when using thermal sensors, incident radiation absorption causes a temperature change in a thermally isolated element. The temperature change is then converted into an electrical signal using a temperature sensitive electrical element. Such sensors that detect temperature changes can also operate efficiently at room temperature and do not require cooling.

The temperature change in uncooled thermal sensors is usually converted to an electrical signal using one of three methods. Thermocouples can be used to measure the temperature difference between the sensor and the ambient temperature, with low sensitivity to the ambient temperature and there is no need for an applied voltage or current. The common approach today utilizes resistive bolometers that measure the absolute temperature of a temperature-sensitive resistor. A third common option is pyroelectric sensors that change the charge in a capacitor in response to temperature changes.

The main disadvantage of uncooled thermal sensors has been the long response time, which is limited by the thermal time constants. The revolution of micromachining created a renaissance for uncooled thermal sensors since it enabled the fabrication of a sensor with a small thermal capacity and high thermal isolation, that give rise to high sensitivity and short response times appropriate for conventional video frame rates.

Conventional designs of uncooled FPA's include a CMOS chip for the array readout circuitry, on top of which a sacrificial layer and sensor material layers are patterned and then released using surface micromachining. The sensor materials include materials that are not part of the CMOS process and are usually considered unconventional in the microelectronics industry. As a result, these chips cannot be fully fabricated using standard CMOS lines, and post processing steps required after the standard CMOS fabrication may affect the CMOS devices performance due to non-compatibility. Yield and cost are therefore still a problem, while performance does not approach that of the traditional cooled sensors.

There are patents and publications regarding other types of uncooled sensors, such as microbolometers, pyroelectric sensors and thermoelectric sensors and also sensors that use diodes and thermo-mechanical devices for uncooled detection.

Therefore, there is a need to provide an array of uncooled infrared transistor-based sensors for use in micromachining and microsensors with improved cost, yield and performance characteristics.

SUMMARY OF THE INVENTION

Accordingly, it is a principal object of the present invention to provide an array of uncooled infrared transistor-based sensors for use in micromachining and microsensors with improved cost, yield and performance characteristics.

It is a further principal objective of the current invention to provide CMOS transistors on a silicon-on-insulator (SOI) substrate, especially for working in the subthreshold regime of the transistors It is another principal objective of the current invention to provide micromachined uncooled sensors and arrays that are composed of standard Complementary Metal Oxide Semiconductor (CMOS) transistors on SOI for thermal imaging applications.

It is a still further objective of the current invention to provide CMOS transistors for both detection of temperature changes and signal multiplexing and processing, It is yet another objective of the current invention to provide lower cost of FPA's and improve performance by using sensitive and adaptive modes of operation.

An infrared uncooled sensor and focal plane array (FPA) device is described, which can provide improved cost, yield and performance by full use of Complementary Metal Oxide Semiconductor (CMOS) components. The device includes a silicon-on-insulator bulk selectively micromachined to achieve thermal isolation, which itself includes a single crystal silicon bulk, a buried thin device silicon layer and a thin silicon dioxide layer to provide the thermal insulation between the single crystal silicon bulk and the thin device silicon layer.

The device also includes at least one element of thermally isolated Metal Oxide Semiconductor (TMOS) transistors with temperature dependent electrical parameters, electrical and thermal conductors independently connecting the transistors to electrical circuits on the single crystal silicon bulk, a thin layer for the absorption of infrared radiation and a CMOS chip with readout circuits for sensor signal multiplexing, amplification and processing, wherein the transistors are operated by the CMOS chip circuits in a regime with maximal temperature sensitivity of electrical properties, including drain current, threshold voltage, gain and local Fermi level. The electrical noise is designed to be minimal.

The transistors are thermally isolated from the single crystal silicon bulk by a selective etching process of the silicon bulk and the thin layers and electrically connected to the CMOS circuits on the CMOS chip in areas above the single crystal silicon bulk, and wherein the TMOS transistors and the electrical conductors are covered with layers and structures that absorb infrared radiation and thus respond with temperature changes to radiation changes that are transduced into a meaningful electrical signal by the transistors and the supporting electronic circuits, such that the device is able to provide improved cost, yield and performance.

Additional features and advantages of the invention will become apparent from the following drawings and description.

BRIEF DESCRIPTIONS OF THE DRAWINGS

Figure 2:
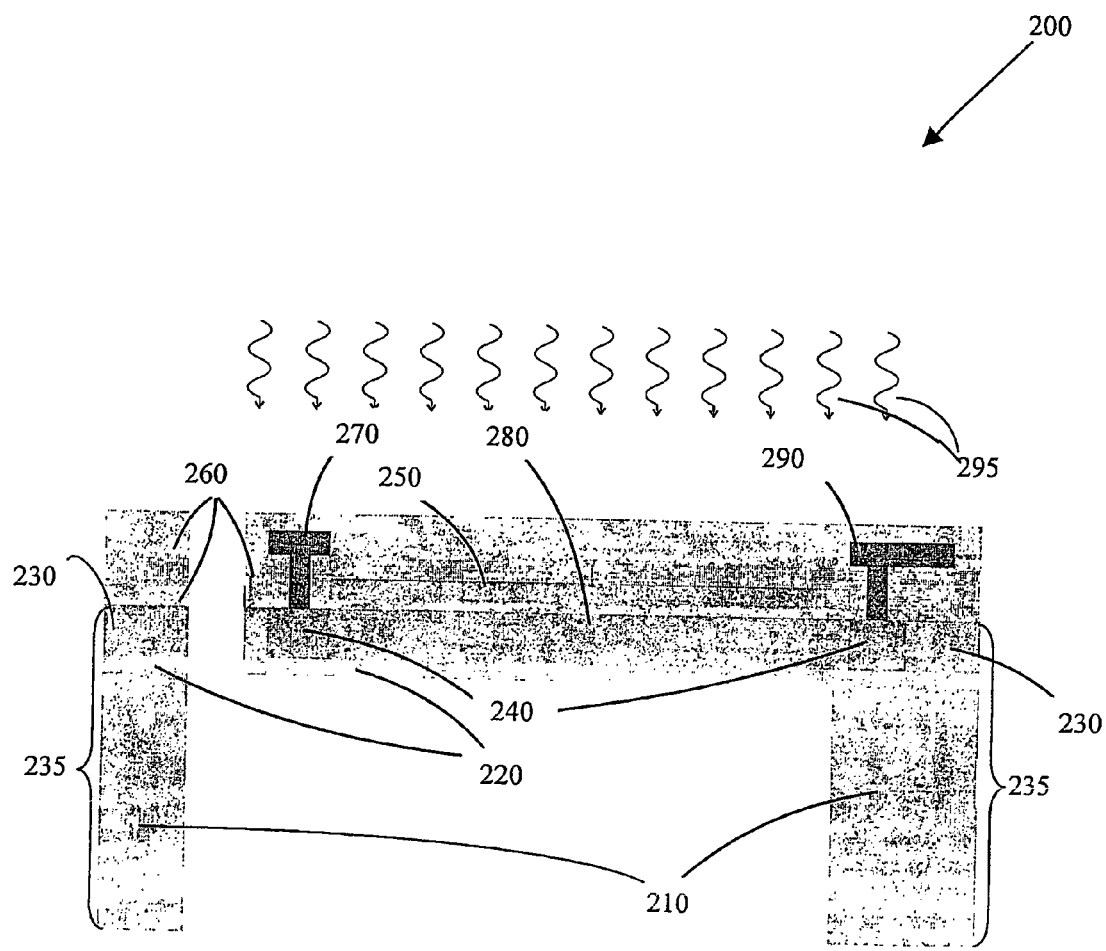
Figure 3:
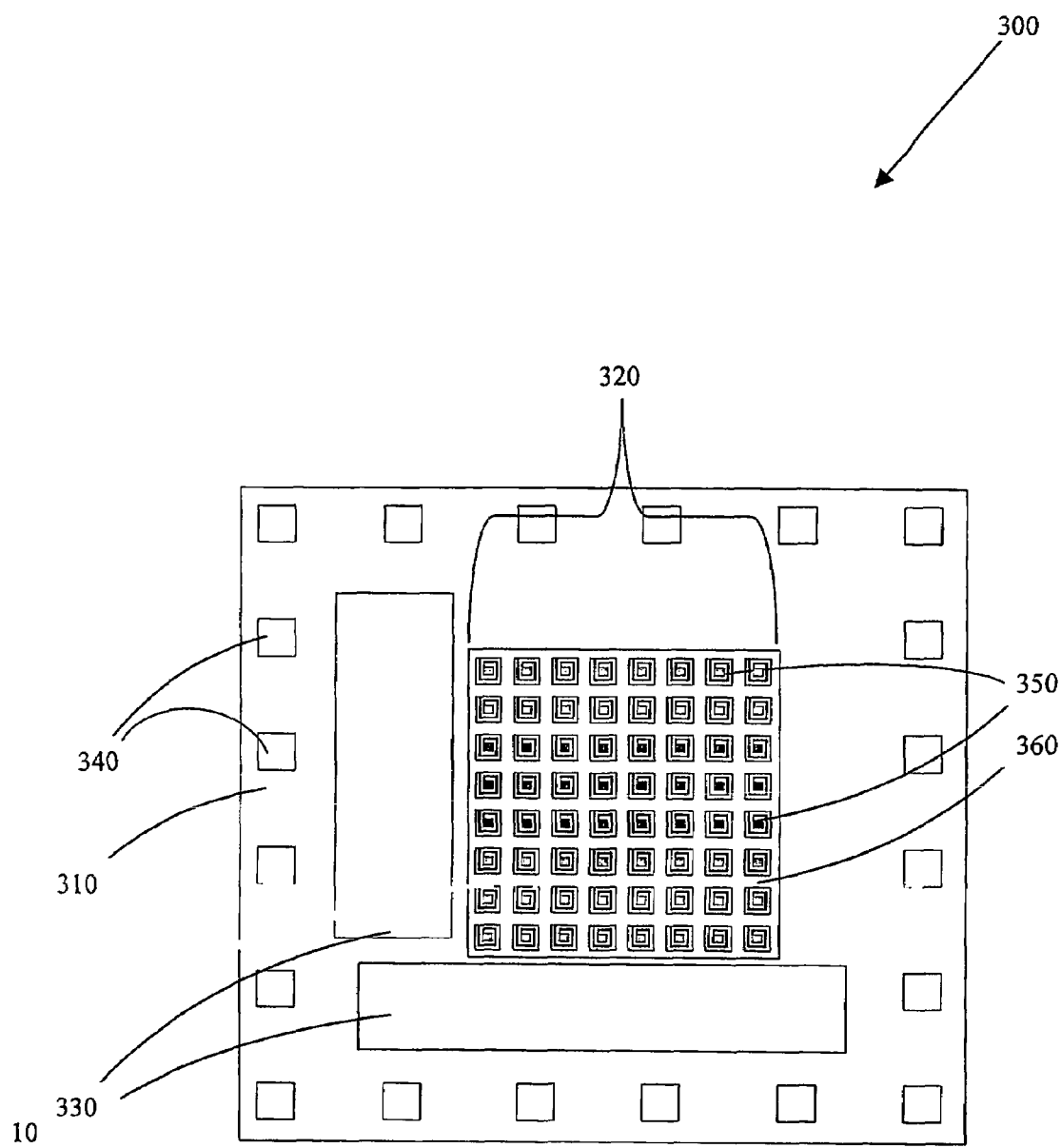

For a better understanding of the invention in regard to the embodiments thereof, reference is made to the accompanying drawings and description, in which like numerals designate corresponding elements or sections throughout, and in which:

FIG. 1 illustrates a typical pixel of a Thermally isolated Metal Oxide Semiconductor (TMOS) transistor on a silicon-on-insulator substrate, in accordance with the present invention, which responds with current, threshold voltage and gain changes to infrared radiation, constructed in accordance with the principles of the present invention;

FIG. 2 illustrates a typical pixel of a thermally isolated MOS transistor on a silicon-on-insulator substrate, in accordance with the present invention, which responds with Fermi level changes along its channel to infrared radiation, constructed in accordance with the principles of the present invention; and FIG. 3 illustrates a typical 8-by-8 pixel array of infrared sensors, in accordance with the present invention, used as a thermal imager, constructed in accordance with the principles of the present invention.

DETAILED DESCRIPTION OF THE PREFERRED EMBODIMENTS

The invention will now be described in connection with certain preferred embodiments with reference to the following illustrative figures so that it may be more fully understood.

References to like numbers indicate like components in all of the figures.

The infrared uncooled sensor and focal plane array is explained, with reference to FIG. 1, illustrating a cross section of a typical sensor pixel 100 of a Thermally isolated Metal Oxide Semiconductor (TMOS) transistor on a silicon-on-insulator (SOI) substrate that responds with current, threshold voltage and gain changes to infrared radiation, constructed in accordance with the principles of the present invention.

The sensor structure is based on a single crystal silicon bulk 110, preferably micromachined using an anisotropic deep silicon reactive ion etching (DRIE). A buried thin silicon dioxide layer 120 serves as an etch stop layer for the bulk micromachining process and separates the bulk silicon from the thin device single crystal silicon layer 130. The stack of thin device silicon layer 130 on top of thin silicon dioxide layer 120 on top of thick silicon bulk 110 is known as SOI 135, and is preferably fabricated from standard silicon wafers using processes that include oxygen implantation and high temperature annealing and thermal oxidation. An increase in the top silicon layer thickness, and increased control of its properties, is preferably achieved using epitaxial growth of silicon.

The non-etched silicon bulk 110 serves as a heat sink to the thermal sensors due to the high thermal conductivity of the silicon and the large thickness of silicon bulk 110. Silicon bulk 110 is etched under the sensor area in order to provide thermal isolation for increased temperature responsivity.

Above the etched area a structure composed of standard Complementary Metal Oxide Semiconductor (CMOS) thin film layers remains. The structure is preferably designed to achieve maximal thermal resistance, so that incident radiation 190 is absorbed in the suspended structure, and induces a temperature increase. The temperature increase is measured by the change in the electrical parameters of an MOS transistor that is integrated in the suspended structure.

The bulk of the transistor is the patterned top thin device silicon layer 130. The source and drain implanted areas 140, a polysilicon gate 150, electrical insulating layers 160 and metal contacts 170 are fabricated as part of a standard CMOS process. Electrical conductors 180 are used to connect the transistor to readout circuits outside the sensor pixel on the same chip.

The temperature affects the several electrical parameters of the MOS transistor. The threshold voltage of the transistor has a typical temperature coefficient of $-1$ mV/$^\circ$ K., resulting from the intrinsic carrier concentration and the bandgap energy dependence upon temperature, and causes a drain current increase with temperature. The charge carrier density in the inversion channel strongly depends on temperature at weak inversion due to the exponential nature of the thermal generation, causing a drain diffusion current increase with temperature. The mobility of charge carriers in the inversion layer also depends on temperature due to the temperature dependency of scattering mechanisms.

In silicon at, or near, room temperature, mobility decreases with temperature, causing a drain current decrease with temperature. When the transistor is in saturation, the dominant temperature dependency is the drop in channel mobility, which results in a typical negative temperature coefficient of current (TCC) of $-0.5\%/^\circ$ K. However, when the transistor is operated subthreshold, the threshold voltage and thermal generation temperature dependencies are more dominant, resulting in large positive TCC's up to $10\%/^\circ$ K.

The transistor is preferably voltage biased to achieve maximum drain current sensitivity to temperature. The MOS transistor is preferably a positive-channel Metal Oxide Semiconductor (PMOS) transistor in order to minimize the 1/f noise.

Electrical conductors 180, that connect the transistor to the CMOS readout circuits outside the sensor pixel 100, dominate the thermal conductance of the sensor pixel to the thermal bath, and are preferably structured in a spiral in order to decrease the total thermal conductance. In the side view of FIG. 1, only one of electrical conductors 180 is visible. The changes in threshold voltage and drain current cause measurable changes in the transistor trans-conductance and gain.

Reference is now made to FIG. 2, illustrating a cross section of a typical sensor pixel 200 of a thermally isolated TMOS transistor on a silicon-on-insulator substrate, which responds with Fermi level changes along its channel to infrared radiation, constructed in accordance with the principles of the present invention.

The sensor structure is based on a similar SOI bulk material to the one described with reference to FIG. 1. Selective etching of the silicon bulk 235 is also performed in a similar way in order to achieve high thermal isolation of sensor pixel 200 and an effective heat sink in the residual bulk. Above the etched area, a structure composed of standard CMOS thin film layers remains.

The structure is preferably designed to achieve maximal thermal resistance, so that incident radiation 295 is absorbed in the suspended structure, and induces a temperature difference between the designated "hot" contact 270 and the designated "cold" contact 290, which is kept at the heat sink temperature by the thick silicon bulk 210. Again, a buried thin silicon dioxide layer 220 serves as an etch stop layer for the bulk micromachining process.

The temperature increase is measured by the spontaneous voltage difference between two contacts 270 and 290. Two contacts 270 and 290 are the source and drain 240, respectively, of an MOS transistor, with a polysilicon gate 250 and electrical insulating layers 260, all fabricated as part of a standard CMOS process. An applied voltage on the gate 250 creates an inversion layer 280 in the thin silicon layer 230, electrically connecting two contacts 270 and 290.

Due to the temperature gradient along the inversion layer, there is also a gradient in the temperature-dependent Fermi energy level along the inversion layer, resulting in a generated voltage between two contacts 270 and 290, which is proportional to the temperature difference. The voltage is measured with an additional conductor (not shown in this cross-section) connecting the "hot" contact with circuitry on the chip. Alternatively and preferably the voltage is measured by another transistor with opposite polarity, e.g. negative-channel Metal Oxide Semiconductor (NMOS) instead of PMOS, so that a net signal of approximately double magnitude is achieved, similar to a thermocouple. Gate voltage is used to control the thermoelectric properties of the sensor.

Reference is now made to FIG. 3, illustrating a top view of a typical 8-by-8 pixel array of infrared sensors used as a thermal imager 300, constructed in accordance with the principles of the present invention. Thermal imager 300 is based on a CMOS chip 310 that is fabricated on an SOI bulk material. CMOS chip 310 includes an array area 320 and a peripheral area. The peripheral area includes two readout circuits 330 for the selection, amplification and signal processing of the electrical signals coming out of the array, as well as bonding pads 340 for the electrical connection of the thermal imager to allow outside communication with the chip. Array area 320 includes a two dimensional array of sensor pixels as described in FIG. 1.

Array area 320 of sensor pixels can be small for low cost imaging applications, such as the 8-by-8 array shown, or as large as a 640-by-480 array for video format thermal imaging. Each sensor pixel 350 is thermally isolated from the silicon bulk and from its neighboring pixels by bulk micromachining of the silicon bulk underneath it preferably using DRIE. The residual silicon mesh, together with the peripheral area, serves as the thermal bath of the array. In the vicinity of each pixel 350, in areas above unetched silicon bulk 360, additional CMOS readout circuitry may, optionally, be added for signal processing at the pixel level, such as differential current integration over the duration of the imager frame time, thus reducing the effective noise bandwidth. Individual control over the operation point of each pixel 350 allows compensation of array non-uniformity. Use of high frequency alternating gate voltage bias allows reduction of the contribution of the MOS transistor 1/f noise.

It should be clear that the above description of the embodiments of the present invention and the Figures disclosed are given for illustrative purposes only and in no way limit the scope of the invention as defined in the appending claims.

Having described the present invention with regard to certain specific embodiments thereof, it is to be understood that the description is not meant as a limitation, since further modifications will now suggest themselves to those skilled in the art, and it is intended to cover such modifications as fall within the scope of the appended claims.

What is claimed is:

1. An infrared uncooled sensor and focal plane array (FPA) device able to provide improved cost, yield and performance by full use of Complementary Metal Oxide Semiconductor (CMOS) components, the device comprising:
   a silicon-on-insulator (SOI) bulk selectively micromachined to achieve thermal isolation;
   at least one element of thermally isolated Metal Oxide Semiconductor (TMOS) transistors with temperature dependent electrical parameters;
   electrical and thermal conductors independently connecting said transistors to said single crystal silicon bulk;
   a thin layer for the absorption of infrared radiation; and
   a CMOS chip with readout circuits for sensor signal multiplexing, amplification and processing,
   wherein said TMOS transistors and said electrical conductors are covered with layers and structures that absorb infrared radiation and thus respond with temperature changes that are transduced into a meaningful electrical signal by said transistors and said supporting electronic circuits.

2. The device according to claim 1, said SOI bulk further comprising:
   a single crystal silicon bulk;
   a thin device silicon layer; and
   a buried thin silicon dioxide layer to provide said thermal insulation between said single crystal silicon bulk and said thin device silicon layer.

3. The device according to claim 1, further comprising: electrical and thermal conductors independently connecting said transistors to said single crystal silicon bulk.

4. The device according to claim 1, wherein said transistors are operated by said CMOS chip circuits in a regime with maximal temperature sensitivity of electrical properties comprising at least one of the following:
   drain current;
   threshold voltage;
   gain; and
   local Fermi level,
   and wherein noise is designed to be minimal, and wherein said transistors are thermally isolated from said single crystal silicon bulk by a selective etching process of the silicon bulk and said thin layers are electrically connected to said CMOS circuits on said CMOS chip in areas above said single crystal silicon bulk.

5. The device according to claim 1, wherein said at least one element is in the form of array of a plurality of elements.

6. The device according to claim 1, wherein said thin layer for the absorption of infrared radiation is in the form of a structure.

7. The device according to claim 1, wherein the infrared uncooled sensor is an infrared uncooled sensor pixel.

8. The device according to claim 7, wherein said thermal isolation is achieved by backside deep reactive ion etching of said silicon bulk under each sensor pixel.

9. The device according to claim 8, wherein said transistor is placed in the point of maximal thermal resistance with respect to said silicon bulk.

10. The device according to claim 8, wherein said transistor is a PMOS transistor.

11. The device according to claim 8, wherein said transistor is operated under subthreshold conditions and maximal temperature current sensitivity.

12. The device according to claim 8, wherein said thermal conductors are structured in a spiral or serpentine structure.

13. The device according to claim 8, wherein said transistor serves as both the sensing element and the pixel selection element.

14. The device according to claim 8, wherein said transistor gate bias is pulsed to decrease 1/f noise.

15. The device according to claim 8, wherein said transistor gate bias is unique to each pixel to reduce non-uniformity.

16. The device according to claim 8, wherein differential current integration is performed at the pixel level for frame time duration.

17. The device according to claim 1, wherein said buried silicon dioxide layer serves as an etch-stop layer for said silicon bulk etching process.

18. The device according to claim 1, wherein said CMOS chip contains low noise signal processing circuits for said sensor array readout.

19. The device according to claim 1, wherein said temperature sensitivity of said transistor drain current is used to detect said temperature changes.

20. The device according to claim 1, wherein said temperature sensitivity of said Fermi energy in the transistor inversion layer of said transistor is used to detect temperature changes.

21. The device according to claim 20, wherein the said transistor source is placed on the thermal bath.

22. The device according to claim 20, wherein the said transistor drain is placed on the point of maximal thermal resistance with respect to the silicon bulk.

23. The device according to claim 20, wherein voltage difference between the said transistor source and drain is used to sense the temperature difference between the sensor and the thermal bath.

24. The device according to claim 20, wherein said transistor serves as both the sensing element and the pixel selection element.

25. The device according to claim 20, wherein said transistor gate bias is pulsed to modulate the sensor voltage output.

26. The device according to claim 20, wherein said transistor gate bias is unique to each pixel to reduce non-uniformity.

27. The device according to claim 20, wherein an NMOS transistor and a PMOS transistor are connected in series to double the signal.

28. The device according to claim 1, wherein said temperature sensitivity of said transistor gain is used to detect said temperature changes.

29. The device according to claim 1, wherein said temperature sensitive element can be used to detect chemical reactions that emit or absorb heat.

30. The device according to claim 1, wherein the device can be modified for mechanical sensing of vibrations and motion.

31. The device according to claim 1, wherein the device can be optimized to control at least one process parameters from the following group: silicon thickness; doping; and metal and polysilicon thickness.

32. The device according to claim 1, further comprising readout circuits for the device.

33. The device according to claim 1, wherein the device can be improved by introducing compensation schemes.

34. A method for an infrared uncooled sensor and focal plane array (FPA) device able to provide improved cost, yield and performance by full use of Complementary Metal Oxide Semiconductor (CMOS) components, the method comprising:

providing a silicon-on-insulator bulk selectively micromachined to achieve thermal isolation comprising the steps of:
  providing a single crystal silicon bulk;
  providing a thin device silicon layer; and
  providing a buried thin silicon dioxide layer to provide said thermal insulation between said single crystal silicon bulk and said thin device silicon layer;
providing at least one element of thermally isolated Metal Oxide Semiconductor (TMOS) transistors with temperature dependent electrical parameters;
providing electrical and thermal conductors independently connecting said transistors to said single crystal silicon bulk;
providing a thin layer for the absorption of infrared radiation; and
providing a CMOS chip with readout circuits for sensor signal multiplexing, amplification and processing,
wherein said transistors are operated by said CMOS chip circuits In a regime with maximal temperature sensitivity of electrical properties comprising at least one of the following:
  drain current;
  threshold voltage;
  gain; and
  local Fermi level,
and wherein noise is designed to be minimal, and wherein said transistors are thermally isolated from said single crystal silicon bulk by a selective etching process of the silicon bulk and said thin layers and electrically connected to said CMOS circuits on said CMOS chip in areas above said single crystal silicon bulk, and wherein said TMOS transistors and said electrical conductors are covered with layers and structures that absorb infrared radiation and thus respond with temperature changes to radiation changes that are transduced into a meaningful electrical signal by said transistors and said supporting electronic circuits,
such that the method is able to provide improved cost, yield and performance.

* * * * *